United States Patent
Bensahel et al.

(10) Patent No.: US 7,381,267 B2
(45) Date of Patent: Jun. 3, 2008

(54) HETEROATOMIC SINGLE-CRYSTAL LAYERS

(75) Inventors: Daniel Bensahel, Grenoble (FR); Olivier Kermarrec, Gieres (FR); Yves Morand, Grenoble (FR); Yves Campidelli, Grenoble (FR); Vincent Cosnier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 336 days.

(21) Appl. No.: 10/816,214

(22) Filed: Apr. 1, 2004

(65) Prior Publication Data
US 2004/0250752 A1 Dec. 16, 2004

(30) Foreign Application Priority Data
Apr. 3, 2003 (FR) .................... 03 04152

(51) Int. Cl.
*C30B 23/00* (2006.01)
*H01L 21/00* (2006.01)

(52) U.S. Cl. .................... 117/91; 117/97; 117/101; 438/45; 438/46; 438/435

(58) Field of Classification Search .............. 117/9, 117/91, 97, 101; 438/45, 46, 435
See application file for complete search history.

(56) References Cited

U.S. PATENT DOCUMENTS

| | | | |
|---|---|---|---|
| 4,229,237 A * | 10/1980 | Bensahel et al. | 438/46 |
| 4,263,056 A * | 4/1981 | Bensahel et al. | 438/45 |
| 4,396,929 A | 8/1983 | Ohki et al. | |
| 4,806,996 A | 2/1989 | Luryi | |
| 5,158,907 A | 10/1992 | Fitzgerald, Jr. | |
| 5,279,687 A | 1/1994 | Tuppen et al. | |
| 5,285,086 A | 2/1994 | Fitzgerald, Jr. | |
| 5,981,400 A | 11/1999 | Lo | |
| 6,399,502 B1 * | 6/2002 | Hernandez et al. | 438/692 |
| 7,033,438 B2 * | 4/2006 | Bensahel | 117/101 |
| 7,129,563 B2 * | 10/2006 | Cosnier et al. | 257/616 |
| 2002/0008241 A1 | 1/2002 | Edmond et al. | |

OTHER PUBLICATIONS

English Translation of JP 2002-359189.*
French Search Report from French Patent Application No. 03/04152, filed Apr. 3, 2003.
Patent Abstracts of Japan, vol. 2003, No. 04, Apr. 2, 2003 & JP 2002 359189 A (Mitsubishi Materials Silicon Corp.; Mitsubishi Materials Corp.), Dec. 13, 2002.
Patent Abstracts of Japan vol. 011, No. 031)E-475), Jan. 29, 1987 & JP 61 198713 A (Fujitsu Ltd.) Sep. 3, 1986.

* cited by examiner

*Primary Examiner*—Robert M. Kunemund
*Assistant Examiner*—G. Nagesh Rao
(74) *Attorney, Agent, or Firm*—Lisa K. Jorgenson; James H. Morris; Wolf, Greenfield & Sacks, P.C.

(57) ABSTRACT

A method for forming, by epitaxy, a heteroatomic single-crystal semiconductor layer on a single-crystal semiconductor wafer, the crystal lattices of the layer and of the wafer being different, including forming, before the epitaxy, in the wafer surface, at least one ring of discontinuities around a useful region.

7 Claims, 2 Drawing Sheets

HETEROATOMIC SINGLE-CRYSTAL LAYERS

BACKGROUND OF THE INVENTION

1. Field of the Invention

The present invention relates to the epitaxial growth of hetero-atomic single-crystal layers. The present invention more specifically relates to the forming of such layers on a semiconductor material of different crystallographic parameters.

2. Discussion of the Related Art

The forming of silicon-germanium layers, SiGe, on a single-crystal silicon substrate will be considered hereafter as an example, and the case where a very thin strained silicon layer is desired to be formed on the SiGe layer will more specifically be considered.

In a given crystallographic system, in which the elementary lattice has a determined dimension, the electronic characteristics, and especially the mobility of the carriers (electrons/holes), are determined. It has been shown that it could be desirable to modify the lattice parameters to optimize the electronic characteristics. In particular, in the case of silicon, it has been shown that, if the dimension of the elementary lattice was increased (the value of the lattice parameter), this would enable forming of elementary components, of which a critical dimension (for example, the channel length or the base thickness) could be reduced.

To obtain silicon with an increased elementary lattice (strained silicon), it has been provided to form a silicon layer on a crystal layer having a lattice larger than the normal lattice of single-crystal silicon. In particular, it has been provided to deposit a very thin layer (a few atomic thicknesses, for example, from 5 to 20 nm) of silicon on a silicon-germanium layer of selected composition to have a determined lattice parameter.

FIG. 1 is a partial simplified cross-section view illustrating the forming, on a single-crystal silicon substrate 1, of a silicon-germanium layer 2 which will be called the "pseudo-substrate" and of a silicon layer 3. Upon epitaxial deposition of pseudo-substrate 2, the latter grows, on a few first atomic thicknesses, with a same lattice parameter a1 as that of substrate 1. Then, the presence of germanium causes a progressive deformation of the crystal lattice, the lattice parameter of which varies from value a1 to a value a2. Final value a2 depends on the proportion of introduced germanium, possibly increasing along the deposition. Upon subsequent epitaxial deposition of silicon layer 3, said layer starts its growth with a strained lattice parameter equal to underlying parameter a2. Electronic components may then be formed so that at least one of their portions, for example, a MOS transistor channel region or a bipolar transistor base area, is formed in layer 3.

It is thus desired to obtain a defect-free layer 3. "Defect-free" here means comprising a surface density of defects on the order of that of standard silicon substrates, of approximately $1/cm^2$. The defects of layer 3 are mainly the consequence of the defects of pseudo-substrate 2. Now, current methods of epitaxial forming of silicon-germanium on silicon result in SiGe layers exhibiting too high a defect density, over $10^4/cm^2$.

SUMMARY OF THE INVENTION

The present invention aims at providing a method for forming a silicon-germanium layer on a silicon substrate that provides an active layer with a very low density of defects.

The present invention also aims at providing such a method that is compatible with existing technological processes.

To achieve these and other objects, the present invention provides a method for forming, by epitaxy, a heteroatomic single-crystal semiconductor layer on a single-crystal semiconductor wafer, the crystal lattices of the layer and of the wafer being different, comprising the step of forming, before the epitaxy, in the wafer surface, at least one ring of discontinuities around a useful region.

According to an embodiment of the present invention, the layer is a silicon-germanium layer and the wafer is a silicon trench.

According to an embodiment of the present invention, an insulating trench is formed, after the epitaxy, at the ring location, the trench surrounding an active area intended to contain at least one elementary component.

According to an embodiment of the present invention, the rings have a square or rectangular shape and their limits are arranged according to paths of subsequent cutting of the wafer in electronic chips.

According to an embodiment of the present invention, the ring is formed of a trench dug into the substrate.

According to an embodiment of the present invention, the ring is formed of a rough area, the roughness of which exhibits a mean square deviation ranging between 10 and 30 nm.

According to an embodiment of the present invention, an additional single-crystal semiconductor layer is formed by epitaxy on the heteroatomic layer, the natural crystal lattice of the material forming the additional layer being different from that of the heteroatomic layer, whereby the additional layer is strained according to the lattice of the heteroatomic layer.

According to an embodiment of the present invention, the additional layer is a silicon layer.

The present invention also provides a single-crystal semiconductor layer covered with a heteroatomic single-crystal semiconductor layer, the crystal lattices of the layer and of the wafer being different, wherein the wafer surface comprises at least one discontinuity ring around a useful region.

According to an embodiment of the present invention, the heteroatomic layer is a silicon-germanium layer and the wafer is a silicon wafer.

The foregoing objects, features, and advantages of the present invention will be discussed in detail in the following non-limiting description of specific embodiments in connection with the accompanying drawings.

DETAILED DESCRIPTION

For clarity, as usual in the representation of integrated circuits, the various drawings are not drawn to scale.

Figure 1:
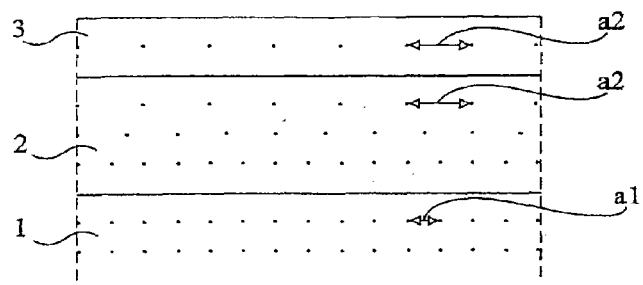
FIG. 1, previously described, illustrates in a partial simplified cross-section view a structure according to the state of the art.
Figure 2:
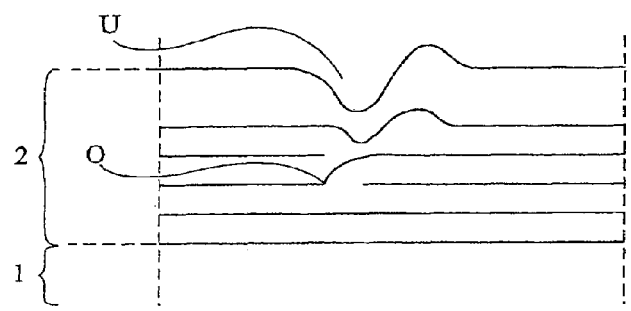
FIG. 2 schematically and partially illustrates the forming of defects in the structure of FIG. 1.

FIG. 2 is a partial simplified cross-section view illustrating a known mechanism of propagation of a defect on forming of a silicon-germanium layer by epitaxy with the introduction of an increasing proportion of germanium. As described previously, the first heteroatomic planes follow the crystal lattice (a1) of underlying substrate 1, and are thus homogeneous. Due to the presence of germanium, the next planes tend to deform and dislocations randomly appear at points O. The existence of dislocations translates in the superposed planes as thickness variations, ripple U, that extends in privileged directions from the region vertically above source dislocation O. The ripple extends and deepens during the epitaxial growth due to the fact that the presence of ripple favors the appearance of dislocations in the superposed levels, which dislocations themselves generate ripple.

The present invention provides a method enabling localization of the defects in a heteroatomic layer outside of a useful area.

Figure 3A:
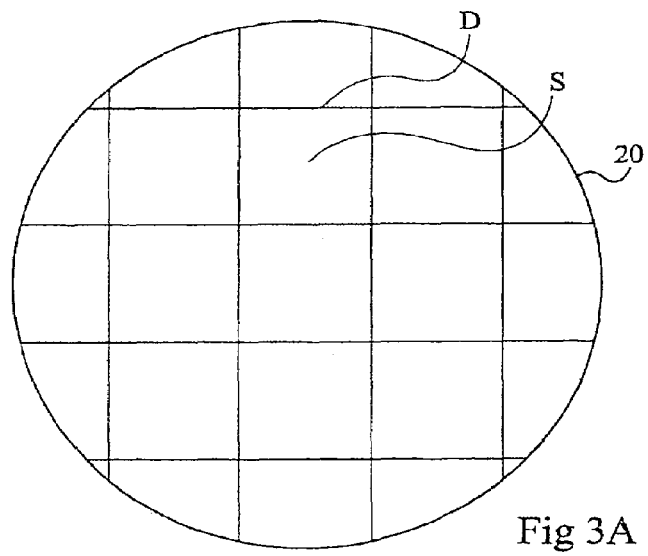
FIGS. 3A and 3B illustrate, in partial simplified top view, an embodiment of the present invention.
Figure 3B:
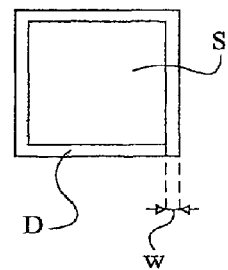

According to the present invention, as illustrated in FIGS. 3A and 3B, in partial simplified top view, at least one ring-shaped region D, preferably square- or rectangular-shaped, surrounds a useful region S of a substrate 20. Useful region S corresponds to an active area in which must be formed one or several elementary components. Ring-shaped region D comprises one discontinuity element (surface or groove irregularity) formed in the surface of substrate 20.

Width W of ring D depends on the size of the useful surface S that it defines, on the number and the proximity of the rings, on the nature of the discontinuities that they comprise, and on the nature of the deposited layer.

FIGS. 4A to 4D illustrate, in partial simplified cross-section view, successive steps of an embodiment of the present invention.

Figure 4A:
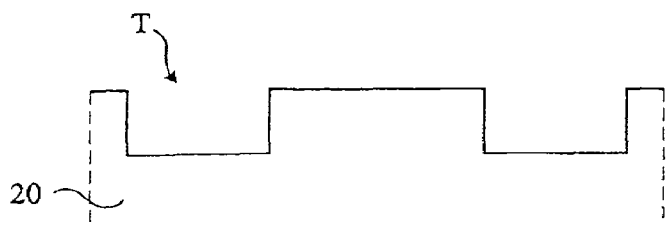
FIGS. 4A to 4D illustrate, in partial simplified cross-section view, different steps of a method according to the present invention.

As illustrated in FIG. 4A, trenches T are dug into a silicon substrate 20 to surround a useful region S.

Figure 4B:
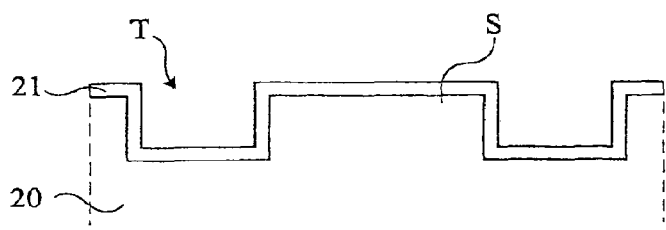

At the next step, illustrated in FIG. 4B, a silicon-germanium layer 21 is grown over the entire substrate 20, that is, in trenches T and on useful region S. SiGe 21 is deposited by epitaxy with a progressive introduction of germanium to reach a desired proportion, for example ranging between 0 and 50% of germanium.

According to an embodiment, useful region S is an elementary active area intended for the forming of a single elementary component, such as a diode, a MOS transistor, or a bipolar transistor. Trenches T then have a depth on the order of from 100 to 700 nm, for example, approximately 500 nm. Preferably, the width of each trench T is chosen to be on the order of the desired insulating width between two active areas. Thus, in a technology where an elementary dimension, for example, the gate length of a MOS transistor, is 90 nm, width w of trenches T will range between 100 and 180 nm, for example, 120 nm.

Upon growth of SiGe layer 21, it can be observed that the region vertically above trenches T traps dislocations and that the central portion of SiGe layer 21 in useful region S is defect-free.

Figure 4C:
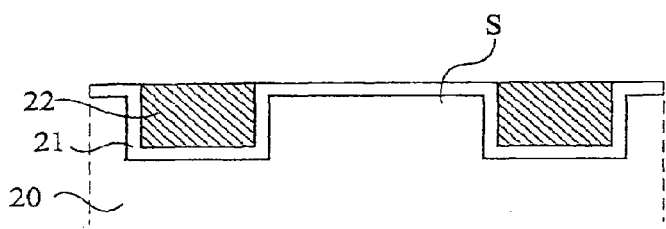

In the embodiment of FIGS. 4A-4B, the thickness of the deposited SiGe layer is much smaller than the depth of trenches T. There then remain trenches at the periphery of the useful areas. It is possible, as illustrated in FIG. 4C, to fill these trenches with an insulating layer 22, for example, made of silicon oxide. Useful areas surrounded with trenches filled with an insulator are thus obtained, which corresponds to a conventional separation mode between elements of an integrated circuit.

Figure 4D:
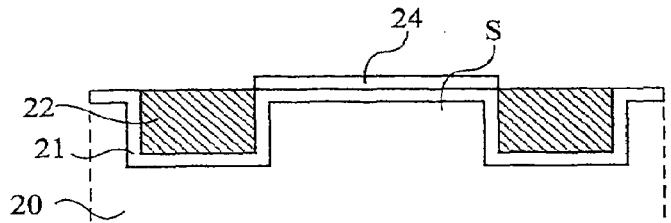

The method then carries on with steps specific to the device formed in useful region S. It is started, for example, as illustrated in FIG. 4D, with an epitaxial growth of a strained silicon layer 24 intended to form at least part of the channel of a MOS transistor or of the base of a bipolar transistor.

In the preceding embodiment, it has been considered as a non-limiting example that trenches T correspond to STI-type insulation trenches and useful region S corresponds to an elementary active area.

More generally, a discontinuity ring is preferably formed in an unused region of the substrate surface, for example, an area intended to be oxidized, a boundary separating components or groups of elementary components, a region corresponding to a cutting path of a chip or the edge of a wafer. The ring dimensions may vary along with those of useful surface area S. Beyond dimensions on the order of 1×1 mm$^2$, the ring dimensions are of at most 2% of those of the useful region S that it surrounds. For example, the surface may be on the order of 1×1 mm$^2$ and width w of the ring will then be smaller than 20 μm.

When allowed by its width, the ring may contain a plurality of parallel trenches. Such is for example the case of rings of a 100-μm width formed in cutting paths of electronic chips of a surface of 3×3 cm$^2$.

It has been previously considered that the surface discontinuities formed in the surface of a substrate are trenches. They may however be a succession of simple recesses distributed according to a ring-shaped pattern around a useful region. Generally, they may be any surface unevenness.

Figure 5A:
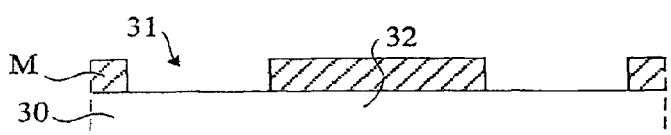
FIGS. 5A to 5C illustrate, in partial simplified cross-section view, another embodiment of the present invention.
Figure 5B:
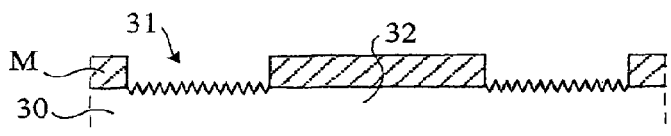
Figure 5C:
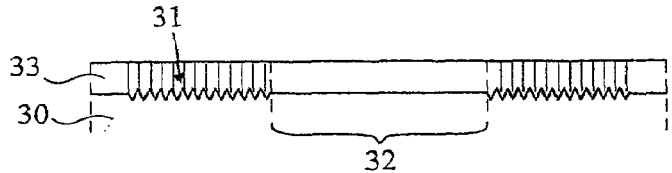

FIGS. 5A to 5C illustrate, in partial simplified cross-section view, another embodiment of the present invention.

As illustrated in FIG. 5A, a silicon substrate 30 is partially covered with a mask M to expose a ring 31 around a region 32.

At the next steps, illustrated in FIG. 5B, a method capable of increasing the roughness of the silicon surface of ring 31 is implemented.

Methods for increasing the roughness of a silicon surface are known, and are, for example, a chemical etch method with a low-concentration etch solution, or a dry etch with a lightly-aggressive plasma. The increased roughness of the silicon of the surface of ring 31 is, for example, such that the average square deviation of the defects thus formed ranges between 10 and 30 nm.

On subsequent epitaxy, illustrated in FIG. 5C, of a silicon-germanium layer 33, the dislocations concentrate above ring 31 around the region vertically above region 32.

It should be noted that the orientation of the axis of the ring according to the present invention is preferably that of occurrence of dislocations. Thus, it is known that in a wafer (110) or (111), the dislocations appear in majority in directions <110> and <111>, respectively. Thus, defect concentration rings according to the present invention will be oriented according to these axes.

Of course, the present invention is likely to have various alterations, modifications, and improvements which will readily occur to those skilled in the art. In particular, the present invention applied to the forming of germanium-silicon layers on a silicon substrate has been described previously. However, discontinuity rings intended to trap dislocations according to the present invention may be used on any forming by epitaxy on a first single-crystal semiconductor material of a first lattice parameter of layers of a second heteroatomic single-crystal semiconductor material of a second lattice parameter. The present invention thus also applies to the growth of a heteroatomic layer containing atoms of groups III and V on a substrate comprising at least a same atom as the layer.

Further, those skilled in the art should understand that the previously-described embodiments may be combined. Thus, discontinuity rings may be formed in locations of different nature in a same substrate. For example, rings may be formed on the edges, in cutting paths, and around elementary components of a same semiconductor wafer. When several rings are formed in a same substrate, each one may contain a different discontinuity.

It should also be noted that discontinuities may be combined in a same ring. Thus, it is possible to combine the digging of trenches with an increase in roughness.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming, by epitaxy, a heteroatomic single-crystal semiconductor layer on a single-crystal semiconductor wafer, the crystal lattices of the layer and of the wafer being different, the method comprising:

first forming in the wafer surface, before epitaxy, at least one ring of discontinuities around a useful region of the wafer by forming at least one rough area in the wafer surface around the useful region, wherein said rough area includes a plurality of surface irregularities distributed over the wafer surface within said ring of discontinuities; and subsequently forming, by epitaxy, the heteroatomic single-crystal semiconductor layer directly on the wafer surface.

2. The method of claim 1, wherein the layer is a silicon-germanium layer and the wafer is a silicon trench.

3. The method of claim 1, wherein an insulating trench is formed, after the epitaxy, at the ring location, said trench surrounding an active area intended to contain at least one elementary component.

4. The method of claim 1, wherein said rings have a square or rectangular shape and their limits are arranged according to paths of subsequent cutting of the wafer in electronic chips.

5. The method of claim 1, wherein the roughness of said rough area exhibits a mean square deviation ranging between 10 and 30 nm.

6. The method of claim 1, wherein an additional single-crystal semiconductor layer is formed by epitaxy on the heteroatomic layer, the natural crystal lattice of the material forming the additional layer being different from that of the heteroatomic layer, whereby the additional layer is strained according to the lattice of the heteroatomic layer.

7. The method of claim 6, wherein the additional layer is a silicon layer.

* * * * *